May 6, 1969 R. GLÜCK ET AL 3,442,724
SEMI-CONDUCTOR ELEMENTS WITH DISTURBED CRYSTALLINE SURFACE STRUCTURE IN A JUNCTION AREA
Filed July 6, 1966
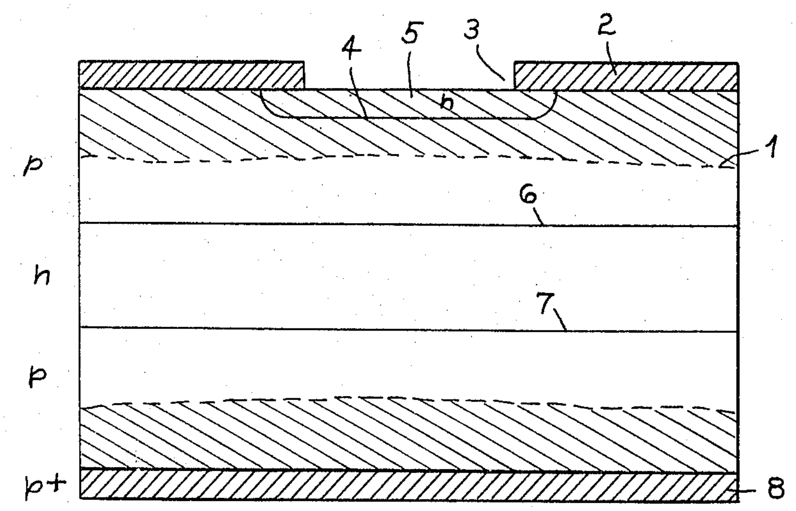
INVENTORS
Roswitha Glück
Edgar Lutz
Horst Riess
Klaus Weinmann
By Pierce, Scheffler & Parker Attys United States Patent Office 3,442,724
Patented May 6, 1969

3,442,724

SEMI-CONDUCTOR ELEMENTS WITH DISTURBED CRYSTALLINE SURFACE STRUCTURE IN A JUNCTION AREA

Roswitha Glück, Burstadt, Edgar Lutz, Feucht, and Horst Riess and Klaus Weinmann, Lampertheim, Germany, assignors to Aktiengesellschaft Brown, Boveri & Cie, Baden, Switzerland, a joint-stock company
Filed July 6, 1966, Ser. No. 563,170
Claims priority, application Germany, July 10, 1965, B 82,778
Int. Cl. H01l 11/06
U.S. Cl. 148—187 3 Claims

ABSTRACT OF THE DISCLOSURE

In a method of making a semi-conductor element regions of different conductivity (pn) are first established in the body of the element. The entire surface of one face of the body is then abrasion lapped to create a disturbed zone, this surface is then masked, a portion of the mask is removed to expose a portion of the disturbed zone underneath, and a doping substance is then diffused into this portion of the disturbed zone to form bordering zones of opposing semi-conductivity type or zones of like conductivity type but of different conductance. The junctions thus established by the bordering zones are protected by the mask.

The present invention relates to an improved semi-conductor element, in particular for switching, with several pn junctions, preferably on the basis of germanium, silicon or an intermetallic compound, and to a novel method for producing such a semi-conductor element.

It is known that the switch-off behavior of semi-conductor elements is determined among other factors, by the presence of so-called "catch points"—also called "traps"—for the minority charge carriers in the base zone. These traps have the job of reducing the minority charge carriers, present in high concentration in the base zone during the flux phase, so quickly when reverting to the blocking phase that cutting-through of the semi-conductor element in the blocked direction is prevented due to the increasing blocking voltage. Where high switching frequencies are involved, high concentrations of traps are required for this purpose.

To improve their switching behavior, known semi-conductor elements contain in their base zone gold whose atoms act as traps. This gold is diffused in during a special operation of the method.

It is also known from the oxide masking technique to oxidize semi-conductor bodies on their etched and polished surface—i.e. to oxidize the essentially undisturbed crystalline structure—, to remove this oxide film in certain places and to alloy or diffuse doping substances into the semi-conductor body at these places devoid of oxide film. The oxide masking technique permits the pn junctions to be produced in the semi-conductor body in exactly reproducible locations. The fringe areas of the pn junctions thusly produced in the semi-conductor body are generated below the oxide film still remaining on the surface and are protected by it.

Finally, it is also known to produce pn junctions in semi-conductor bodies by diffusing or alloying doping substances into them, then to etch these semi-conductor bodies at least in the areas where the pn junctions come to the surface and to cover the bared pn junctions subsequently with a protective film. This allows pn junctions with a greater blocking ability to be produced than by the oxide masking technique.

The present invention has for its principal purpose the development of a semi-conductor element for high blocking voltages, in particular one having a favorable switch-off behavior, and to produce this semi-conductor element by a simplified method.

This problem is solved according to the invention in that the semi-conductor body, at least at one of its opposing faces, has an area of disturbed crystalline structure and that, at least in the area of disorganized crystalline structure at the one surface, zones of opposing conductivity type and/or zones of the same conductivity type but different conductance border on one another and the pn junction or junctions thus coming about is or are protected by a oxide film at the surface.

This semi-conductor element is produced according to the method of the invention in that the semi-conductor body, after at least two pn junctions have been produced in its area of undisturbed crystalline structure by diffusion, known as such, is provided in its disturbed zone with a dense surface oxide film having a masking effect for doping substances like phosphor or boron; that this oxide film is partially removed and that a doping substance is so diffused into the surfaces of the semi-conductor body freed of the oxide film that zones of opposing conductivity type and/or zones of the same conductivity type but different conductance border on one another in the area of disturbed crystalline structure and the junction or junctions thus coming about is or are protected by the remaining oxide film.

As compared to the known methods, the method claimed permits two operations to be saved, namely, that of polishing the lapped surface prior to oxidizing and that of diffusing special traps in for the minority charge carriers—the lattice dislocations in the area of disturbed crystalline structure acting as such.

The invention is based on the realization, among others, that the blocking voltage, is predominantly at pn junctions carrying no electrodes. It is possible, therefore, to produce the electrodes and the pn junctions formed by them by the oxide masking technique with every precise and reproducible geometry advantageous for the switch-on behavior. It has also been realized in the present invention that the last mentioned pn junctions can also be placed in the area of disorganized crystalline structure without impairing the blocking ability of the entire semi-conductor element. And finally it has been realized that a dense oxide film, having a masking effect for doping substances like phosphor or boron, can also be produced on the disturbed crystal.

According to one expedient implementation of the method according to the invention, the area of disorganized crystalline structure is produced by abrasion lapping, in a manner known as such.

By using lapping media of different grain size it is possible to adjust the depth of the area of disturbed crystalline structure within wide limits. The employment of a coarse lapping medium leads to a severe destruction of the superficial crystal zone. This zone then has a high concentration of traps. The degree of destruction and, hence, the concentration of traps decreases with increasing depth. When finer lapping media are used, the crystals at the surface are destroyed correspondingly less. Here too, the degree of destruction decreases with increasing depth, but the depth of the destroyed crystal zone is correspondingly less. In this manner, the concentration of traps in the zone, determining the switching speed and the switch-off behavior of the semi-conductor element, can be varied.

Where applicable, the desired depth of the destroyed crystal range and, hence, the concentration of traps in the base zone will also be determined, among other factors, by etching the semi-conductor body after lapping to varying extents.

Finally, the emitter can be diffused to varying extends into the disturbed crystal range, and the switch-off behavior of the semi-conductor element can thus be varied by fixing the trap concentration in the base zone.

To describe the semi-conductor elements according to the invention in more detail, reference is now made to the accompanying drawing which illustrates one implementation example schematically.

The drawing shows the cross-section of a disk-shaped npnp four-layer element with a silicon body. The crystalline structure of this element has been destroyed to a certain depth 1 at the surface of one side. On this destroyed crystal range lies an oxide film 2, removed in an area 3. Below this part of the semi-conductor element which is bared of the oxide film is a pn junction 4 in the destroyed crystal range. In its fringe area, this pn junction is protected by the remaining oxide film 2. Due to its location in the destroyed crystal range, the pn junction 4, produced in a manner known as such by diffusing emitter 5 in (doping substance with donor properties, in the present case phosphor), has only a very weak blocking ability. The pn junctions 6 and 7 lie in the, by comparison, undisturbed crystal interior and have a strong blocking ability. In the present case, they have also been produced by diffusion known as such—namely of a doping substance with acceptor properties, in this case, aluminum. The electrode 8 at the outer p layer is produced by techniques known as such. In the present case it consists of aluminum and serves, like the —not illustrated—electrode at the outer n layer, to connect the lead-ins to the two mentioned main electrodes. A control electrode for the semi-conductor element according to the invention is provided which surrounds annularly the outer n layer in particular, but this electrode is also not illustrated.

The semi-conductor element according to the invention distinguishes itself by a switch-off speed adjustable within wide limits and by a production method simplified compared to semi-conductor elements having previously been known for the same purpose.

We claim:

1. A method of producing a semi-conductor element for use in particular as a switching transistor which comprises the steps of:

forming in a body of crystalline semi-conductor material from the group consisting of germanium, silicon and intermetallic compounds at least two regions of different types of semi-conductivity, abrasion lapping the entire surface of one face of said semi-conductor body to produce adjacent to said surface a disturbed crystalline zone, covering said zone of disturbed crystalline material with an oxide film having a masking effect for a doping substance from the group consisting of phosphor and boron, removing a portion of said oxide film so as to expose a corresponding surface portion of said disturbed crystalline zone, and diffusing said doping substance into said exposed portion of said disturbed crystalline zone, the diffusion being limited to said disturbed crystalline zone to develop therein bordering zones of opposing semi-conductivity type or zones of like semi-conductivity but of different conductance, the junction or junctions thus established being protected by the remaining portion of said oxide film.

2. A method of producing a semi-conductor element as defined in claim 1 wherein said step of abrasion lapping is carried out by using lapping mediums with different grain sizes to adjust the depth of the zone of disturbed crystalline material.

3. A method of producing a semi-conductor element as defined in claim 1 wherein said step of diffusing said doping substance into said exposed portion of said disturbed crystalline zone is carried out to a variable depth dependent upon the desired switch-off speed for the semi-conductor element.

References Cited

UNITED STATES PATENTS

| | | | |
|---|---|---|---|
| 2,935,453 | 5/1960 | Saubestre | 204—29 |
| 3,209,428 | 10/1965 | Barbaro | 29—25.3 |
| 3,262,234 | 7/1966 | Roach | 51—320 |
| 3,366,851 | 1/1968 | Harlet et al. | 317—235 |

JOHN W. HUCKET, *Primary Examiner.*

R. SANDLER, *Assistant Examiner.*

U.S. Cl. X.R.

317—235